United States Patent [19]

Niina et al.

[11] Patent Number: 4,607,369
[45] Date of Patent: Aug. 19, 1986

[54] SEMICONDUCTOR LASER HAVING A BURYING LAYER OF A II-VI COMPOUND

[75] Inventors: Tatsuhiko Niina; Keiichi Yodoshi, both of Osaka, Japan

[73] Assignee: Sanyo Electric Co., Ltd., Japan

[21] Appl. No.: 480,460

[22] Filed: Mar. 30, 1983

[30] Foreign Application Priority Data

Apr. 9, 1982 [JP] Japan .................................. 57-60152

[51] Int. Cl.$^4$ .............................................. H01S 3/19
[52] U.S. Cl. ......................................... 372/46; 357/17; 372/48
[58] Field of Search .................. 372/44, 45, 46, 48; 357/17

[56] References Cited

U.S. PATENT DOCUMENTS 4,033,796 7/1977 Burnham et al. ..................... 372/48
4,121,177 10/1978 Tsukada et al. ...................... 372/46
4,481,631 11/1984 Henry et al. ......................... 372/46

Primary Examiner—James W. Davie
Attorney, Agent, or Firm—Darby & Darby

[57] ABSTRACT

A semiconductor laser includes an oscillation layer comprising a first clad layer, an active layer and a second clad layer which are comprised of gallium aluminum arsenide and deposited, in this order, on a semiconductor substrate. A buried cap layer in a stripe geometry for narrowing a width of a current path is deposited on a second clad layer. A burying layer comprised of II-VI compound such as zinc selenide, zinc sulfide and the like is formed on the second clad layer other than the portion on which the cap layer is formed, so that the cap layer is buried. The buried layer is formed utilizing a low temperature deposition such as a molecular beam epitaxy.

25 Claims, 13 Drawing Figures

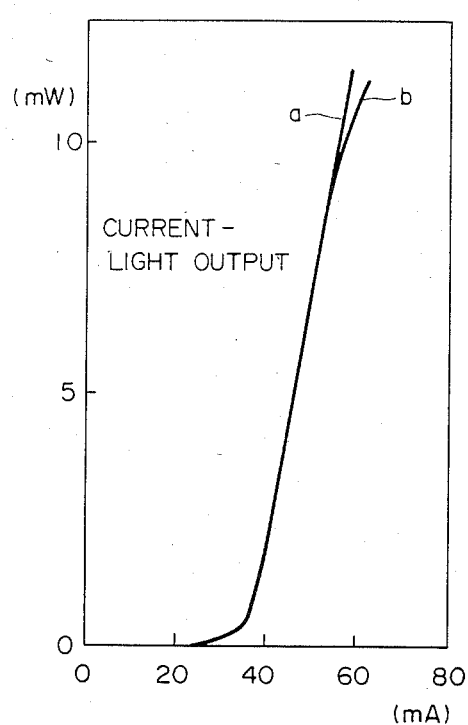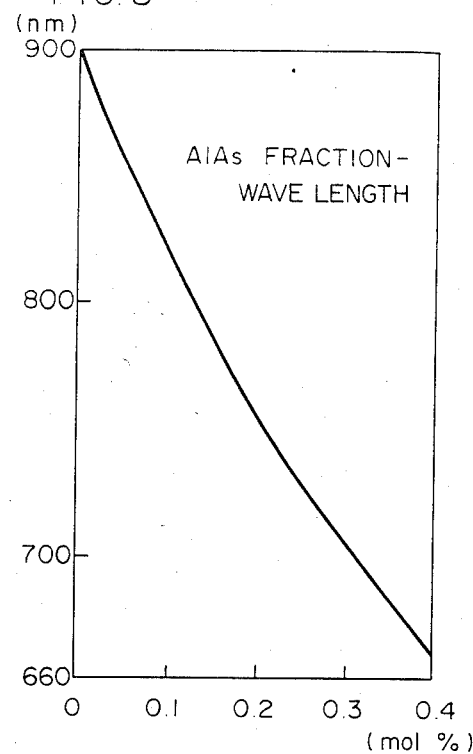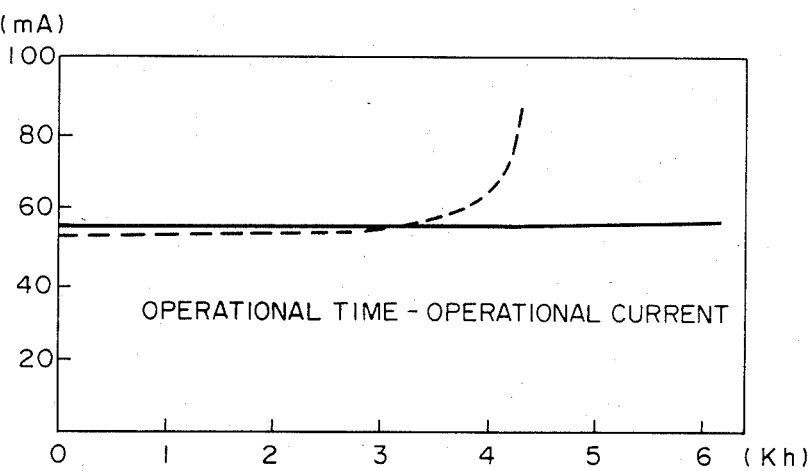

SEMICONDUCTOR LASER HAVING A BURYING LAYER OF A II-VI COMPOUND

BACKGROUND OF THE INVENTION

1. Field of the Invention

The present invention relates to a semiconductor laser and more particularly, relates to a semiconductor laser of a stripe structure having a buried layer of II-VI compound.

2. Description of the Prior Art

In recent years in the technical field of semiconductor lasers, a number of lasers of a stripe structure have been developed for the purpose of achieving a low threshold current and a single transverse mode oscillation. One of the objects in this development is to narrow the current path.

FIG. 1 shows a typical type of laser which comprises a substrate 1 of n type GaAs (Gallium Arsenide) the major surface of which includes a crystal face or facet, an oscillation layer 2 deposited on the substrate, a cap layer 6 deposited on the oscillation layer 2 and comprised of n type GaAs having a good ohmic characteristic, a diffusion region 7 of P+ type in which Zn (zinc) is partially diffused from the surface of the cap layer to a second clad layer 5, and first and second ohmic electrodes 8 and 9 which are formed on the surface of the cap layer 6 and other surface of the substrate 1. The oscillation layer 2 includes a first clad layer 3 comprised of n type $Ga_{1-x}Al_xAs$(gallium aluminum arsenide)($0<x<1$), an active layer 4 comprised of $Ga_{1-y}Al_yAs$($0 \leq y<1, x>y$), and a second clad layer 5 comprised of P type $Ga_{1-z}Al_zAs$, which layers 3, 4 and 5 are in turn epitaxially grown and deposited in that order.

In such a semiconductor laser, if and when a forward bias is applied between the first and second electrodes 8 and 9, a current path is narrowed within the diffusion region 7 and a current flows immediately beneath the approximate diffusion region 7. In addition, since the concentration of aluminum in the first and second clad layers 3 and 5 is larger than that of the active layer 4, the band gap of the clad layers 3 and 5 becomes larger and the index of refraction thereof becomes smaller, as compared with the active layer 4.

Accordingly, electrons and holes are well confined in the active layer 4 immediately beneath the diffusion region 7 and also the light caused by recombination of such electrons and holes is well confined in the active layer 4, whereby the laser beam in the single transverse mode with a low current is oscillated from the active layer 4.

On the other hand, in manufacturing the above described laser, the laser must be exposed in the high temperature of 600° C.~650° C. in forming the diffusion region for narrowing the current path. If and when the laser is subjected to high temperature, thermal damage in a growing layer such as the active layer 4 and the like occurs and hence the life of the laser becomes shorter, which was a significant problem. In order to solve such problem, a structure was devised wherein, as shown in Fig. 2, a cap layer 11 is formed in a stripe geometry by P type GaAs and both sides of the cap layer are buried by a layer 12 of high resistivity which is comprised of $SiO_2$ and the like. The laser as shown in FIG. 2 will be explained in the following. The same portions as FIG. 1 are denoted by the same reference numerals so that the explanation thereof is omitted.

In such laser, since the cap layer 11 is formed in a stripe geometry and is buried by the high resistivity layer 12 in both sides of the layer 11, the current path is narrowed to the cap layer 11 by the high resistivity layer 12. Accordingly, the laser beam in a single transverse mode with a low current can be oscillated just as the laser in FIG. 1.

In addition, since the above described high resistivity layer 12 is comprised of $SiO_2$ and the like, the manufacturing process can be made at a relatively low temperature of approximately 300° C. Thus, the problem of shortening the laser life due to thermal damage of the active layer 4 and the like never arise, as the laser of FIG. 1.

However, since thermal expansion coefficients of $SiO_2$ and GaAlAs are different from ($SiO_2$: $0.35 \times 10^{-6}$/°K, GaAlAs: $6.0 \times 10^{-6}$/°K), crystal strain occurs in the second clad layer 5 and the like. The crystal strain mainly occurs in the laser manufacturing process and, more particularly, the strain occurs when the laser is cooled to a normal temperature after the high resistivity layer 12 of $SiO_2$ is formed at the temperature of about 300° C.

Furthermore, the surface of the semiconductor laser on the side of the cap layer 11 is fixed to a heat sink (not shown) for the purpose of enhancing heat radiation. However, the thermal conductivity of $SiO_2$ is relatively low, that is, 0.014 W/cm.° C., the heat caused in the oscillation layer while using the laser can not be transferred to the heat sink and thus is stored within the laser, which causes a thermal break of the oscillation layer 2.

Typical examples of the above described prior art semiconductor lasers are disclosed in Japanese Laying Open Gazette Nos. 86093/1977, 18087/1980, 86181/1980, and 93381/1979. The semiconductor laser disclosed in the Japanese Patent Laying Open Gazzette No. 86093/1977 includes a buried layer comprised of $SiO_2$. The semiconductor laser in Japanese Laying Open Gazette No. 18087/1980 includes a high resistivity layer (buried layer) which is formed at the temperature of 600° C. by means of metal-organic chemical vapor deposition using $Ga(CH_3)_3$ and $AsH_3$. The technique disclosed in the Japanese Laying Open Gazette No. 86181/1980 is directed to an active layer in a semiconductor laser and does not disclose material for a buried layer. The semiconductor laser in Japanese Laying Open Gazette No. 93381/1979 includes a current blocking region (buried layer) comprised of n type $Ga_{1-z}Al_zAs(1>z \geq 0)$ which is formed after melt-back of a clad layer.

SUMMARY OF THE INVENTION

The present invention is directed to a semiconductor laser. The semiconductor laser in accordance with the present invention comprises a semiconductor substrate; an oscillation layer including an active layer and first and second layers between which the active layer is interposed so that light and carriers may be substantially confined therein; a cap layer formed on the second layers in a stripe geometry and for narrowing a current path; and a buried layer comprised of II–VI compound and formed on the second means such that the cap layer is buried.

In a preferred embodiment, the oscillation layer comprises GaAlAs and the buried layer comprises zinc selenide (ZnSe), zinc sulfide (ZnS) or zinc telluride (ZnTe). The buried layer is formed by means of a low temperature deposition such as a molecular beam epitaxy (MBE), metal-organic chemical vapor deposition (MOCVD).

Accordingly, a primary object of the present invention is to provide a semiconductor laser which can be manufactured without any crystal strain and has an excellent heat radiation so that no thermal damage occurs while using the layer.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a graph showing current-light output characteristics of the semiconductor laser in accordance with the present invention and of conventional semiconductor laser having a film of $SiO_2$;

FIG. 5 is a graph showing a change with the passage of time in the semiconductor laser in accordance with the present invention and in a conventional semiconductor laser having a film of $SiO_2$;

FIG. 8 is a graph showing a relation between a mol fraction of AlAs and wavelength in the semiconductor laser in accordance with the present invention.

DETAILED DESCRIPTION OF THE INVENTION

Principle of the Invention

Figure 1:
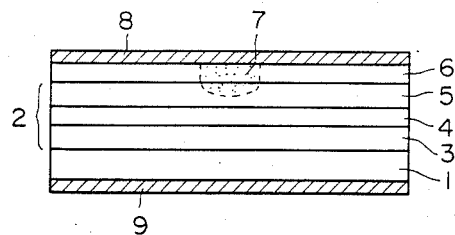
FIGS. 1 and 2 are sectional views showing conventional semiconductor lasers, respectively.

As described in the foregoing, the thermal expansion coefficient of GaAlAs is $6 \times 10^{-6}/°K$ which corresponds to $Ga_{0.5}Al_{0.5}As$. The lattice constant of $Ga_{0.5}As$ is 5.658Å. The principle of the present invention is to use, as a buried layer (high resistivity layer) of a semiconductor laser, material which physical characteristics such as lattice constant and thermal expansion coefficient are approximate to those of GaAlAs and which have a good thermal conductivity. Accordingly, an ideal substance or material used as a buried layer of a semiconductor laser in accordance with the present invention satisfies four requirements that (1) its physical characteristic is extremely close to that of GaAlAs; (2) its thermal conductivity is good; (3) its resistivity is substantially high; and (4) it can be formed at a lower temperature.

The following table indicates lattice constants and thermal expansion coefficients of II-IV compounds.

|  | Zincblende Type | | |
|---|---|---|---|
|  | ZnS($\beta$) | ZnSe | ZnTe |
| lattice constant | 5.409Å | 5.667Å | 6.103Å |
| thermal expansion coefficient | $6.1 \times 10^{-6}$ $°C.^{-1}$ | $7.0 \times 10^{-6}$ $°C.^{-1}$ | $8.2 \times 10^{-6}$ $°C.^{-1}$ |

|  | Wurtzite Type (Hexagonal Type) | | |
|---|---|---|---|
|  | ZnS($\alpha$) | CdS | CdSe |
| lattice constant | a = 3.820Å<br>c = 6.260Å | a = 4.137Å<br>c = 6.716Å | a = 4.299Å<br>c = 7.015Å |
| thermal expansion coefficient | $6.2 \sim 6.5 \times 10^{-6}$ $°C.^{-1}$ | $4.0 \times 10^{-6}$ $°C.^{-1}$ | $4.8 \times 10^{-6}$ $°C.^{-1}$ |

(a = one side of hexagon; c = height)

As seen from the above described table, the physical characteristic of II-VI compound are extremely close to that of GaAlAs. In addition, the thermal conductivity of the II-VI compound is approximately $0.2 \sim 0.3$ W/cm.°C. which is better than the 0.014 W/cm.°C. of $SiO_2$. Some II-VI compound having a large specific resistivity, such as ZnSe, can be used as a buried layer and, some II-VI compound having a somewhat smaller specific resistivity can be also used as a buried layer in a manner that the compound is utilized as a back-bias layer by doping impurities therein. Furthermore, the layer of the II-VI compound can be formed at the temperature of less than 400° C. by means of low temperature deposition process by vacuum evaporation such as molecular beam epitaxy (MBE), electron beam evaporation (EB) and sputtering, or metal-organic chemical vapor deposition (MOCVD).

The substances listed in the above table are by way of illustration and example. Other substances belonging to II-VI compounds, for example, CdTe, HgSe, HgS, HgTe, ZnO or the like, have similar physical characteristics as these in the table.

Description of the Preferred Embodiments

The present invention properly utilizes the various above described characteristics of II-VI compound. Referring to FIG. 3, the semiconductor laser in accordance with a preferred embodiment of the present invention will be described in the following, together with the manufacturing process thereof.

FIG. 3A, 3B, 3C and 3D show four cross sectional views for explaining the process of manufacturing the semiconductor laser of a preferred embodiment. The same portions as in FIG. 1 are labeled by the same reference numerals as in FIG. 1.

Figure 3A:
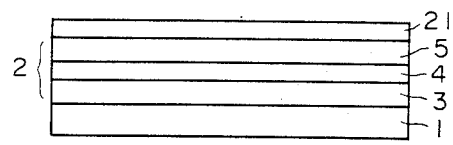
FIGS. 3A, 3B, 3C and 3D are cross sectional views showing manufacturing processes of the semiconductor laser in accordance with a preferred embodiment of the present invention.

FIG. 3A shows the first process step, wherein an oscillation layer 2 including a first clad layer 3, an active layer 4 and a second clad layer 5, and a cap layer 21 of approximately 0.5 μm comprised of P type GaAs are deposited on the n type GaAs substrate 1 in order by an epitaxial growth. In this step, a buffer layer (not shown) may be provided between the n type GaAs substrate 1 and the first clad layer 3 and/or between the second clad layer 5 and the cap layer 21 for the purpose of matching these lattice constants thereof.

Figure 3B:
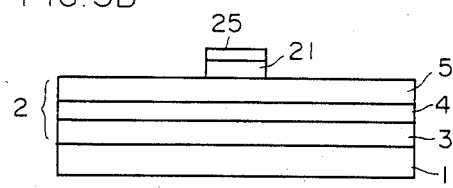
Figure 2:
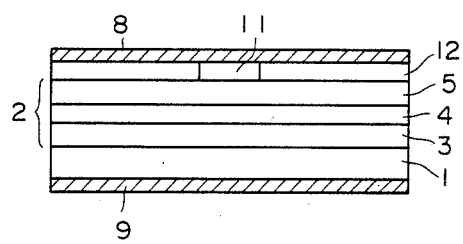

FIG. 3B shows the second process, wherein the cap layer 21 is formed in stripe geometry of 5 μm in width, which extends in a direction perpendicular to the surface of the drawing.

In such a process, first a film of $SiO_2$ or $Si_3N_4$ is deposited over the whole surface of the cap layer 21. Then, unnecessary portions of the film are removed by means of a photolithography technique so that a remaining portion of 5 μm in width of the film is left extending in a direction perpendicular to the upper surface, resulting in the SiO$_2$ film (or Si$_3$N$_4$ film) 25 of a mesa stripe. Thereafter, a portion of the cap layer 21 on which the film 25 of mesa stripe is not formed is removed by a suitable etchant. At that time, even removal of a portion of the second clad layer 5 in the above described etching involves no problem.

Figure 3C:
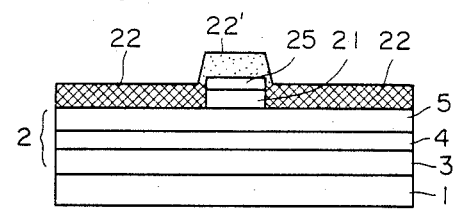

FIG. 3C shows the third process step, wherein a burying layer 22 comprised of an non-doped single crystal of ZnSe is formed on the surface of the SiO$_2$ film (or Si$_3$N$_4$ film) 25 and the exposed surface of the second clad layer 5 by means of a molecular beam epitaxy. Gallium may be doped into the ZnSe, and in this case, the burying layer 22 becomes an n type of a back-bias layer.

The above described growth of the burying layer 22 by means of the molecular beam epitaxy is made in a vacuum container with a vacuum of the over $10^{-8}$ Torr, the temperature of zinc source of 300° C., and the temperature of the selenium source of 200° C. for thirty minutes. As a result, a non-doped ZnSe layer with thickness of 0.5 μm is grown. At that time, a polycrystal of ZnSe 22' is deposited on the SiO$_2$ film (or Si$_3$N$_4$ film) of mesa stripe and a single crystal of ZnSe 22 is deposited on the P type GaAlAs layer 5.

Figure 3D:
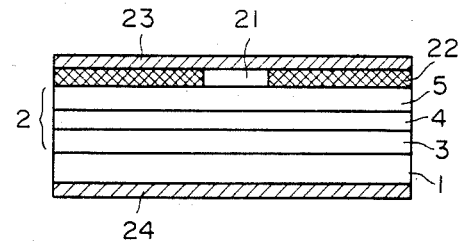

FIG. 3D shows the final process step, wherein the burying layer 22' deposited on the cap layer 21 is removed so that the surface of the cap layer 21 is exposed. The etching is made using aqueous solution of NaOH. More particularly, since the polycrystal ZnSe is etched faster than the single crystal ZnSe, the ZnSe on cap layer 21 can be removed by etching, while leaving the remaining ZnSe 22' other than that on the buried cap layer 21. Thereafter, the film 25 of SiO$_2$ (or Si$_3$N$_4$) is removed.

Thereafter, in order to complete the semiconductor laser, a first ohmic electrode 23 is formed on the surface of the buried cap layer 21 and the surface of the burying layer 22 and a second ohmic electrode 24 is formed on the rear surface of the substrate 1.

In the semiconductor laser in accordance with the present embodiment, if and when a forward bias is applied between the first and second electrodes 23 and 24, the width of the current path is narrowed within the buried cap layer 21 since the burying layer 22 has a high resistivity. Accordingly, the portion immediately beneath the cap layer 21 becomes a main current path and hence laser beam with a low current and in a single transverse mode is oscillated within the active layer 4 located in the current path.

In addition, in the manufacturing process of the semiconductor laser in accordance with the present embodiment, thermal damage never occurs since a layer already deposited is not subjected to high temperature, and there is no risk of crystal strain and the like occurs, since each of the lattice constants and thermal expansion coefficients of the layers of the semiconductor laser are approximately equal to each other. Furthermore, since the burying layer 22 is comprised of ZnSe having much higher thermal conductivity as compared with that of the silicon dioxide (SiO$_2$), the effect of heat radiation is enhanced.

In the above described explanation, the crystal of ZnSe is deposited using the molecular beam epitaxy (MBE). Now, we will describe deposition of the crystal of ZnSe using methods other than the MBE method.

The growth of ZnSe crystal by means of metalorganic chemical vapor deposition (MOCVD) is made using dimethyl zinc (CH$_3$)$_2$Zn and hydrogen selenide (H$_2$Se). With a substrate temperature of 300~350° C., a system pressure of 0.2 Torr and gas ratio of zinc to selenium of 1.2 to 5.5, the crystal of ZnSe is deposited at a growth speed of 2 μm/h.

The growth of crystal of ZnSe by means of sputtering is made using a radio frequency sputtering apparatus in which a single crystal ZnSe is used as a target. With the substrate temperature of 270° C., the growth speed of the ZnSe single crystal is 0.5 μm/h.

The ZnSe crystal can be deposited by means of an electron beam evaporation (EB), although the description thereof is omitted.

In the above described explanation, the burying layer (high resistivity layer) 22 is formed using ZnSe. However, II–VI compounds other than ZnSe may be utilized as material for forming the buried layer 22. From the above described general physical characteristics of the II–VI compound, it can be clear that the result obtained in this case is substantially the same as that in case of ZnSe. As an example, growth of crystal of ZnS and ZnTe by means of a molecular beam epitaxy (MBE) will be described in the following.

The growth of ZnS crystal by means of molecular beam epitaxy is made in a vacuum container with a lower degree of vacuum lower than $10^{-8}$ Torr, a substrate temperature of 350° C., the temperature of the zinc source of 300° C. and the temperature of the sulphur source of 100~150° C. In this case, the growth speed of the ZnS crystal is approximately 1 μm/h.

The growth of ZnTe crystal by means of molecular beam epitaxy is made in a vacuum container with a degree of vacuum lower than $10^{-8}$ Torr, substrate temperature of 350° C., the temperature of the zinc source of 300° C., and the temperature of the tellurium source of 250° C. In this case, the growth speed of the crystal of ZnTe is approximately 1 μm/h.

FIG. 4 is a graph showing the current to light output (I-L characteristic) of the semiconductor laser in accordance with the present invention and a conventional semiconductor laser having a burying layer of SiO$_2$. The abscissa indicates operational current (unit: mA) and the ordinate indicates light output (unit: mW). Curve a represents the I-L characteristic of the semiconductor laser in accordance with the present invention and the curve b represents the I-L characteristic of the conventional semiconductor laser. As seen in the right end of the curve b, the light output characteristic decreases in the high current region, because, it is believed the oscillation layer is damaged due to the heat stored in the interior of the laser. On the contrary, in the semiconductor laser in accordance with the present invention, the light output characteristic does not decrease in the high current region, as shown in curve a.

FIG. 5 is a graph showing the change with the passage of time of the present semiconductor laser and the conventional semiconductor laser. The abscissa represents operational time (unit: a thousand hours) and the ordinate represents operational current (unit: mA). The solid line indicates change with the passage of time in the present semiconductor laser and the dotted line indicates change with the passage of time in the conventional semiconductor laser. These curves indicate the result measured, with an oscillation wavelength of 780 nm, a temperature of 50° C., and light output of 5 mW. Under these conditions, damage with the passage of time in the conventional semiconductor laser starts after the passage of approximately 2500 hours, and remarkable damage occurs after the passage of 3000 hours, which is believed to be caused due to the heat which is not radiated to the exterior and hence stored in the laser. As the damage due heat increases with the passage of time, much more operational current is required to obtain the same light output. On the contrary, damage with the passage of time in the present semiconductor laser is not caused at all even if the passage of time exceeds 6000 hours, as is clear from the graph of the approximately straight line shown by the solid line. This means that the effect of heat radiation of the present semiconductor laser is excellent, which results in the high reliability of the present invention.

Considering the I-L characteristic shown in FIG. 4, together with a change with the passage of time shown in FIG. 5, it can be seen that the deteriorating time period of the conventional laser is very short when the output exceeds 5 mW. On the contrary, damage with the passage of time in the present semiconductor laser is not seen at all with respect to the 5 mW output. In addition, considering the I-L characteristic, damage with the passage of time is believed to almost not be caused with respect to the output of over 5 mW. Accordingly, the present laser has a much higher stability as compared with a conventional laser.

Figure 6:
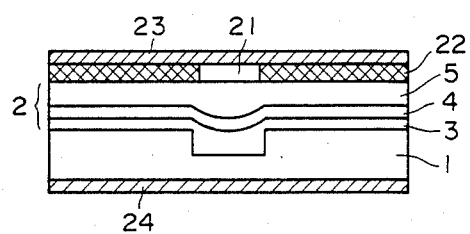
FIG. 6 is a cross sectional view showing a channel substrate planar (CSP) type semiconductor laser in accordance with the present invention.

FIG. 6 shows another embodiment of the present invention. The feature of the embodiment is to apply the present invention to a semiconductor laser of channel substrate planar type. The same portions as in FIG. 3 are labeled by the same reference numerals as in FIG. 3. Such semiconductor laser of the present embodiment also brings about the same meritorious effect as the first embodiment.

Figure 7:
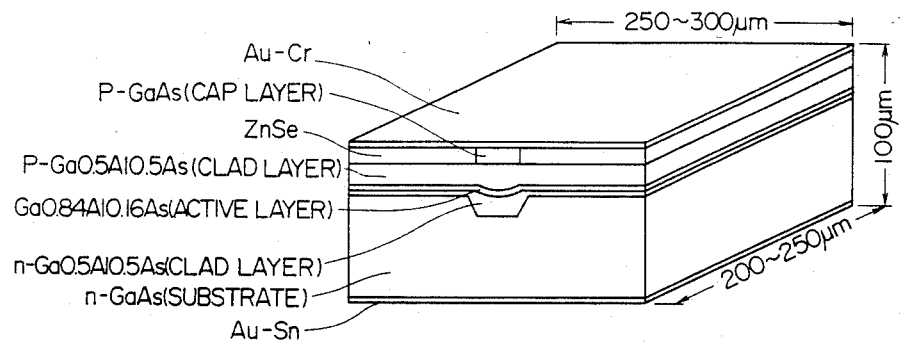
FIG. 7 shows a specific embodiment of the CSP type semiconductor laser in accordance with the present invention.

FIG. 7 shows a specific and actual embodiment of a semiconductor laser of channel substrate planar type in accordance with the present invention. Various values necessary for manufacturing such semiconductor laser of the channel substrate planar type are listed in the following.

somewhat from the theoretical values due to the influence of heat and the like.

From the graph in FIG. 8, it can be seen that in accordance with the present semiconductor laser, the obtained laser beam is in a visible radiation range if and when the mol fraction of AlAs in the active layer exceeds approximately 0.1. Since the mol fraction of AlAs in the clad layer must be 0.2~0.4 larger than that in the active layer for the purpose of oscillation of the laser beam, the laser beam obtained from the present semiconductor laser is in the region of the visible radiation when the mol fraction of the AlAs in the clad layer exceeds about 0.3.

Although, in the above described embodiment, a single crystal is used as the material forming the buried layer, for example, ZnSe, a polycrystal or amorphous material may be used. In this case, thermal damage can be further prevented since the temperature of the substrate is made lower as compared with the growth of a single crystal.

In addition, the present invention is not intended to be limited to a semiconductor laser having a structure shown in the above described embodiment. For example, the present invention can be applied to a semiconductor laser of terrace substrate type and the like and the oscillation layer may be of a double heterojunction type or a single heterojunction type.

Figure 9A:
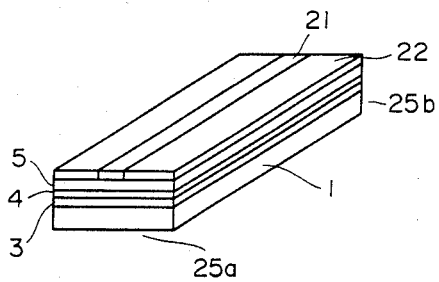
FIGS. 9A and 9B show examples of forming a cap layer.
Figure 9B:
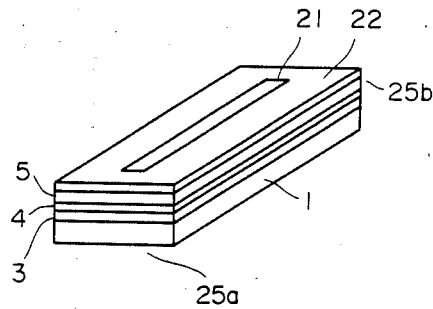

Furthermore, in the above described embodiments, the cap layer 21 is formed such that the layer reaches both surfaces 25a and 25b of both ends which become mirror surfaces at the time of laser oscillation, as shown in FIG. 9A. Alternatively, as shown in FIG. 9B, the cap layer 21 may be formed such that the layer 21 does not reach the above described surfaces 25a and 25b. At that time, the buried cap layer is buried in the burying layer 22 in such a manner that the side surfaces of the cap layer are surrounded by the layer 22. If and when the burying cap layer 21 is formed as shown in FIG. 9B, no

| layer | carrier concentration (cm$^{-3}$) | thickness of layer | mol fraction of Al |
|---|---|---|---|
| $\eta$-GaAs | 1~3 × 10$^{18}$ (Si dope) | about 100 $\mu$m | 0 |
| $\eta$-Ga$_{0.5}$Al$_{0.5}$As (clad layer) | 1 × 10$^{17}$~3 × 10$^{18}$ (Te dope) | groove portion 0.7~2.0 $\mu$m flat portion 0.1~0.3 $\mu$m | Al mol fraction of active layer + 0.2~0.4 |
| Ga$_{0.84}$Al$_{0.16}$As (active layer) | 10$^{15}$~10$^{16}$ (Non dope) S | 0.05~0.1 $\mu$m | |
| P—Ga$_{0.5}$Al$_{0.5}$As (clad layer) | 1 × 10$^{17}$~3 × 10$^{18}$ (Ge dope) | 0.7~2 $\mu$m | Al mol fraction of active layer + 0.2~0.4 |
| P—GaAs (cap layer) | 1 × 10$^{18}$~1 × 10$^{19}$ (Ge dope) | 0.3~1.0 $\mu$m | 0 |
| ZnSe | | width 3~5 $\mu$m thickness 0.3~1.0 $\mu$m | |

The oscillation wavelength of the present semiconductor laser is 780 nm.

In general, the oscillation wavelength of a semiconductor laser including an oscillation layer comprised of GaAlAs changes depending on the value of the mol fraction of AlAs in GaAlAs of an active layer. FIG. 8 is a graph showing the relation between the mol fraction of AlAs and the wavelength of the semiconductor laser in accordance with the present invention. The abscissa represents the mol fraction of AlAs in the active layer and the ordinate represents the oscillation wavelength (unit: nm). According to a theoretical computation of an energy band gap, the mol fraction of AlAs ranges from 0.13 to 0.37 in the region of wavelengths in the range of 810~660 nm. Since the graph in FIG. 8 indicates measured values, such measured values deviate current is applied around the above described surfaces 25a and 25b and hence the damage in such portion can be prevented, which makes the life of the semiconductor laser longer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser comprising:
   a semiconductor substrate having a first surface,
   first electrode means coupled to said semiconductor substrate for supplying electric current thereto, an oscillation layer for generating a laser beam including an active layer in which stimulated emission occurs and including first and second layers between which said active layer is interposed, light and carriers being substantially confined in said active layer, said first layer being disposed over said substrate, said active layer being disposed over said first layer and said second layer being disposed over said active layer, a buried cap layer having a stripe geometry for providing a narrow current path width, said cap layer being disposed over said second layer, a burying layer comprised of a II–VI compound, said burying layer being disposed over said second layer such that said cap layer is buried, and second electrode means coupled to said buried cap layer for coupling electric current thereto.

2. The semiconductor laser in accordance with claim 1, wherein said second layer comprises material having approximately the same lattice constant as that of said burying layer.

3. The semiconductor laser in accordance with claim 2, wherein said material comprises gallium aluminum arsenide (GaAlAs).

4. The semiconductor laser in accordance with claim 1, wherein said burying cap layer and said buried layer include upper surfaces and said upper surface of said cap layer and said upper surface of said burying layer are substantially coplanar.

5. The semiconductor laser in accordance with claim 1, wherein said first layer, said active layer and said second layer included in said oscillation layer comprise gallium aluminum arsenide and said burying layer and buried cap layer include upper surfaces.

6. The semiconductor laser in accordance with claim 5, wherein said II–VI compound comprises zinc selenide (ZnSe).

7. The semiconductor laser in accordance with claim 6, wherein said burying layer comprised of zinc selenide is formed using molecular beam epitaxy.

8. The semiconductor laser in accordance with claim 6, wherein said burying layer comprised of zinc selenide is formed using a metal-organic chemical vapor deposition (MOCVD).

9. The semiconductor laser in accordance with claim 5, wherein said II–VI compound is selected from the group consisting of zinc sulfide and zinc telluride.

10. The semiconductor laser in accordance with claim 9, wherein said burying layer is formed using molecular beam epitaxy.

11. The semiconductor laser in accordance with claim 9, wherein said burying layer is formed using metal-organic chemical vapor deposition (MOCVD).

12. The semiconductor laser in accordance with claim 5, wherein said upper surface of said buried cap layer and said upper surface of said burying layer are substantially coplanar and each of said cap layer and said burying layer is 0.3 to 1 $\mu$m in thickness.

13. The semiconductor laser in accordance with claim 5, wherein said laser beam generated from said oscillation layer is a visible laser beam.

14. The semiconductor laser in accordance with claim 5, wherein the gallium aluminum arsenide in said second means is such that the fraction of aluminum arsenide (AlAs) is over 0.3.

15. The semiconductor laser in accordance with claim 1, wherein said semiconductor substrate is of a channel substrate planar type.

16. A semiconductor laser in accordance with claim 5, wherein said semiconductor substrate is of a channel substrate planar type.

17. A semiconductor laser in accordance with claim 16, wherein said II–VI compound comprises zinc selenide.

18. A semiconductor laser in accordance with claim 17, wherein said burying layer comprised of zinc selenide is formed using a molecular beam epitaxy.

19. The semiconductor laser in accordance with claim 17, wherein said burying layer comprised of zinc selenide is formed using metal-organic chemical vapor deposition (MOCVD).

20. The semiconductor laser in accordance with claim 16, wherein said II–VI compound is selected from the group consisting of zinc sulfied and zinc telluride.

21. The semiconductor laser in accordance with claim 20, wherein said burying layer is formed using molecular beam epitaxy.

22. The semiconductor laser in accordance with claim 20 wherein said burying layer is formed using metal-organic chemical vapor deposition (MOCVD).

23. The semiconductor laser in accordance with claim 16, wherein the upper surface of said buried cap layer and said upper surface of said burying layer are substantially coplanar and each of said cap layer and said burying layer is 0.3 to 1 $\mu$m in thickness.

24. The semiconductor laser in accordance with claim 16, wherein the laser beam generated from said oscillation layer is a visible laser beam.

25. The semiconductor laser in accordance with claim 16, wherein the gallium aluminum arsenide in said second means is such that the fraction of aluminum arsenide (AlAs) is greater than 0.3.

* * * * *